(12) United States Patent
Hamilton et al.

(10) Patent No.: US 6,567,303 B1
(45) Date of Patent: May 20, 2003

(54) CHARGE INJECTION

(75) Inventors: Darlene G. Hamilton, San Jose, CA (US); Janet S. Y. Wang, San Francisco, CA (US); Narbeh Derhacobian, Belmont, CA (US); Tim Thurgate, Sunnyvale, CA (US); Michael K. Han, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/050,483

(22) Filed: Jan. 16, 2002

Related U.S. Application Data

(60) Provisional application No. 60/265,426, filed on Jan. 31, 2001.

(51) Int. Cl.[7] .......................... G11C 16/04; G11C 16/06
(52) U.S. Cl. ............................ 365/185.03; 365/185.18; 365/185.22; 365/185.29
(58) Field of Search ...................... 365/185.03, 185.05, 365/185.11, 185.18, 185.19, 185.22, 185.29, 185.33

(56) References Cited

U.S. PATENT DOCUMENTS

| | | | | |
|---|---|---|---|---|
| 5,949,711 A | * | 9/1999 | Kazerounian | 365/185.05 |
| 6,307,784 B1 | * | 10/2001 | Hamilton et al. | 365/185.03 |
| 6,344,994 B1 | * | 2/2002 | Hamilton et al. | 365/185.05 |
| 6,366,500 B1 | * | 4/2002 | Ogura et al. | 365/185.29 |
| 6,385,093 B1 | * | 5/2002 | Bautista, Jr. et al. | 365/185.29 |

* cited by examiner

Primary Examiner—Trong Phan
(74) Attorney, Agent, or Firm—Amin & Turocy, LLP

(57) ABSTRACT

A system and methodology is provided for programming first and second bits of a memory array of dual bit memory cells at a substantially high delta VT. The substantially higher VT assures that the memory array will maintain programmed data and erase data consistently after higher temperature stresses and/or customer operation over substantial periods of time. At a substantially higher delta VT, programming of the first bit of the memory cell causes the second bit to program harder and faster due to the shorter channel length. Therefore, the present invention employs selected gate and drain voltages and programming pulse widths during programming of the first and second bit that assures a controlled first bit VT and slows down programming of the second bit. Furthermore, the selected programming parameters keep the programming times short without degrading charge loss.

25 Claims, 12 Drawing Sheets

CHARGE INJECTION

CROSS REFERENCE TO RELATED APPLICATION

This application claims the benefit of U.S. Provisional Patent Application No. 60/265,426, filed Jan. 31, 2001, entitled DATA RETENTION CHARACTERISTICS AS A RESULT OF HIGH TEMPERATURE BAKE.

FIELD OF INVENTION

The present invention relates generally to memory systems and in particular to a system and method for programming and erasing sectors of bits in an electronic flash memory device having dual bit memory transistor cells using virtual ground architecture.

BACKGROUND OF THE INVENTION

Flash memory is a type of electronic memory media which can be rewritten and hold its content without power. Flash memory devices generally have life spans from 100K to 300K write cycles. Unlike dynamic random access memory (DRAM) and static random access memory (SRAM) memory chips, in which a single byte can be erased, flash memory is typically erased and written in fixed multi-bit blocks or sectors. Evolving out of electrically erasable read only memory (EEPROM) chip technology, which can be erased in place, flash memory is less expensive and more dense. This new category of EEPROMs has emerged as an important non-volatile memory which combines the advantages of EPROM density with EEPROM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a word line associated with a row of such cells to form sectors of such cells in a typical NOR configuration. In addition, the drain regions of the cells are connected together by a conductive bit line. The channel of the cell conducts current between the source and the drain in accordance with an electric field developed in the channel by the stacked gate structure. In the NOR configuration, each drain terminal of the transistors within a single column is connected to the same bit line. In addition, each flash cell has its stacked gate terminal connected to a different word line, while all the flash cells in the array have their source terminals connected to a common source terminal. In operation, individual flash cells are addressed via the respective bit line and word line using peripheral decoder and control circuitry for programming (writing), reading or erasing functions.

Such a single bit stacked gate flash memory cell is programmed by applying a voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage (VT) of the cell increases. This change in the threshold voltage (and thereby the channel conductance) of the cell created by the trapped electrons is what causes the cell to be programmed.

In order to erase a typical single bit stacked gate flash memory cell, a voltage is applied to the source, and the control gate is held at a negative potential, while the drain is allowed to float. Under these conditions, an electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

In conventional single bit flash memory devices, an erase verification is performed to determine whether each cell in a block or set of such cells has been properly erased. Current single bit erase verification methodologies provide for verification of bit or cell erasure, and application of supplemental erase pulses to individual cells, which fail the initial verification. Thereafter, the erased status of the cell is again verified, and the process continues until the cell or bit is successfully erased or the cell is marked as unusable.

Recently, dual bit flash memory cells have been introduced, which allow the storage of two bits of information in a single memory cell. The conventional programming and erase verification methods employed with single bit stacked gate architectures are not adequate for such dual bit devices. Recently, dual bit flash memory structures have been introduced that do not utilize a floating polysilicon gate, such as an ONO flash memory device that employs a polysilicon layer over the ONO layer for providing wordline connections. Conventional techniques do not address the characteristics associated with these types of devices. Therefore, there is an unmet need in the art for new and improved programming and erase methods and systems, which ensure proper programming and erasure of data bits in a dual bit memory virtual ground architecture, and which account for the structural characteristics thereof.

SUMMARY OF THE INVENTION

A system and methodology is provided for programming first and second bits of a memory array of dual bit memory cells at a substantially high delta VT. The substantially higher VT assures that the memory array will maintain programmed data and erase data consistently after higher temperature stresses and/or customer operation over substantial periods of time. At a substantially higher delta VT, programming of the first bit of the memory cell causes the second bit to program harder and faster due to the shorter channel length. Therefore, the present invention employs selected gate and drain voltages and programming pulse widths during programming of the first and second bit that assures a controlled first bit VT and slows down programming of the second bit. Furthermore, the selected programming parameters keep the programming times short without degrading charge loss.

The present invention allows for efficient and thorough programming, erasure and verification, which minimizes data retention and over-erase issues similar to those caused in an ONO dual bit cell architecture. The invention provides significant advantages when employed in association with dual bit memory cells formed from an ONO architecture. However, it will be recognized that the invention finds utility in association with dual bit memory cell architectures generally, and that the invention is thus not limited to any particular dual bit cell usage implementation or configuration. Although, charge associated with programming of a single bit in the dual bit memory cell is isolated, it causes the associated cell to program harder making it more difficult to erase. For example, residual charge can be accumulated into the central region of the cell, which cannot be erased by a normal erasure of the bit by itself. Therefore, the system and methodology includes programming, verifying and erasure of both a normal bit and a complimentary bit of the cell, which are opposite sides of the same ONO transistor. The erasure includes applying a set of erase pulses to the normal bit and complimentary bit in a single dual bit cell. The set of erase pulses is comprised of a two sided erase pulse to both sides of the transistor followed by a single sided erase pulse to one side and a single sided erase pulse to the other side.

In one aspect of the invention, a system and method is provided for verify erasure of a memory array of dual bit flash memory cells. The system and method include preprogramming of bits in both normal column locations and complimentary column locations and then verify erasure of both bits in normal and complimentary bit column locations. The verify erasure requires that each bit address location pass the erase verify before moving to the next address. Alternatively, the erase verify can be performed on a I/O or word of bits such that the normal bits and complimentary bits of an I/O have to pass before moving on to the next I/O or word. If an address location is not below a maximum VT defining a blank state, a set of erase pulses is applied. The set of erase pulses include a two sided erase pulse to bits in normal and complimentary column locations for a specified duration (e.g., 10 ms) followed by a first single sided erase pulse to bits in one of the normal column locations and complimentary column locations for a specified duration (e.g., 1 ms) and a second single sided erase pulse to bits on the other of the normal column locations and complimentary column locations for a specified duration (e.g., 1 ms). The steps of verifying and erasure are repeated until each normal bit and complimentary bit in a sector are below the maximum VT defining a blank cell. The steps are then repeated for each sector.

The bits are then evaluated to determine if the bits have been over-erased or fall below a minimum VT defining a blank cell. A soft program pulse is provided for the bits determined to have been over-erased. The soft program verify should include a low level source voltage to shutoff the leakage from other cells on the same column. A second or final routine of verify erasure is performed on both the bits in the normal column locations and the complimentary column locations to assure that the soft program pulse did not cause the bits to rise above the maximum VT defining a blank cell.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The following is a detailed description of the present invention made in conjunction with the attached figures. The invention provides methodologies and a system for programming (writing), verifying (reading) and proper erasure of dual bit memory cells operating in a double or dual bit mode. The present invention may be used in conjunction with a chip erase or sector erase operation in a flash memory device. Furthermore, the present invention provides methodologies and a system for proper arrangement and maintenance of dual bit memory cells in an array operating in double bit mode. Although the invention is hereinafter illustrated and described in association with an ONO dual bit memory cell architecture wherein both bits of each cell are used for data storage, it will be appreciated that the invention is applicable to other type architectures and other dual bit architecture usage schemes.

Figure 1:
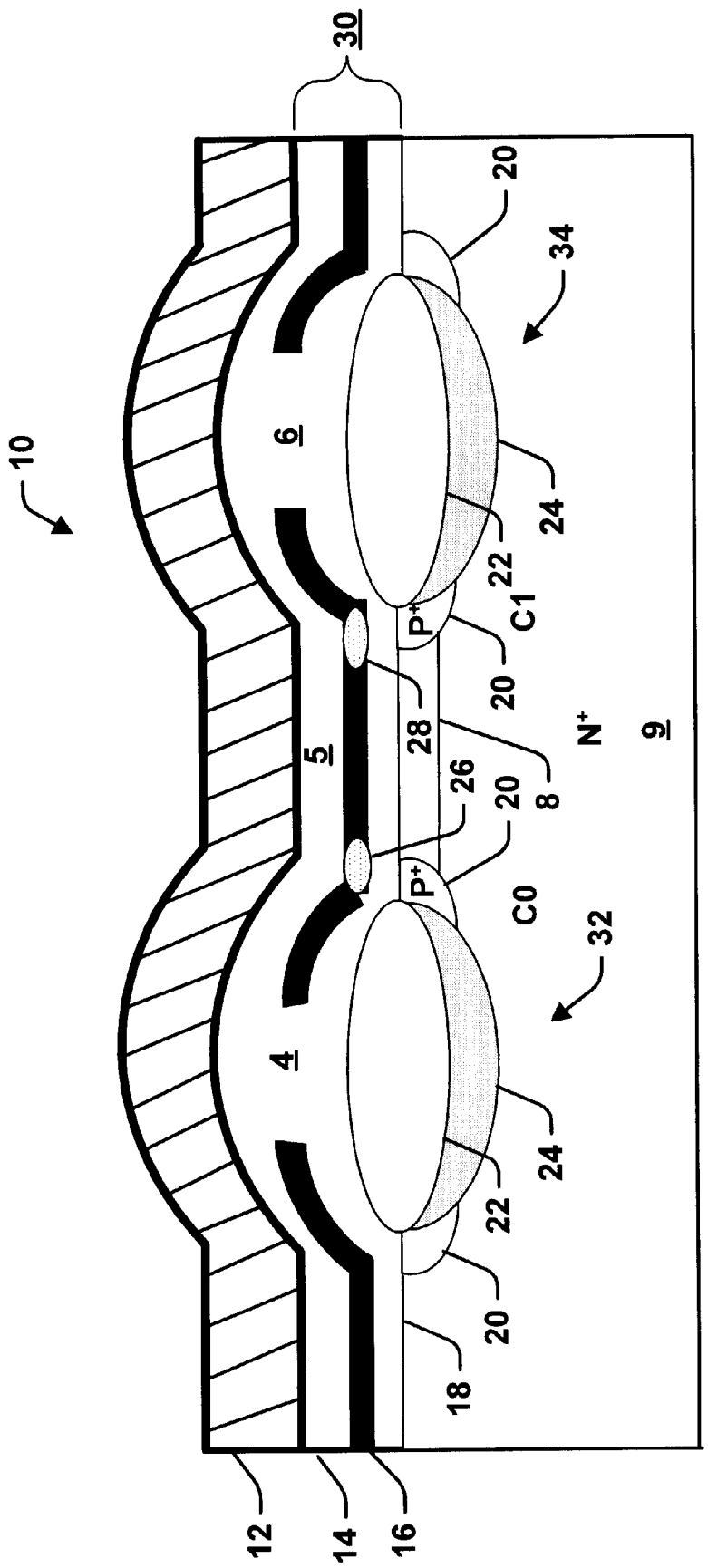
FIG. 1 is a side cross-sectional view of an exemplary dual bit memory cell in which various aspects of the present invention may be implemented.

Referring now to the drawings, FIG. 1 illustrates an exemplary dual bit memory cell 10 in which one or more of the various aspects of the invention may be carried out. The memory cell 10 comprises a silicon nitride layer 16 sandwiched between a top silicon dioxide layer 14 and a bottom silicon dioxide layer 18 forming an ONO layer 30. A polysilicon layer 12 resides over the ONO layer 30 and provides a wordline connection to the memory cell 10. A first bitline 32 runs underneath the ONO layer 30 under a first region 4 and a second bitline 34 runs underneath the ONO layer 30 under a second region 6. The bitlines 32 and 34 are formed of a conductive portion 24 and an optional oxide portion 22. Boron core implants 20 are provided on both ends of each bitline 32 and 34 where the bitlines meets the bottom silicon dioxide layer 18 or along the entire transistor. The boron core implants are more heavily doped than the P-type substrate and assist in control of the VT of the memory cell 10. The cell 10 resides on a P-type substrate 9 with the conductive portion 24 of the bitlines 32 and 34 being formed from an $N^+$ arsenic implant, such that a channel 8 is formed between across the P-type substrate. The memory cell 10 is comprised of a single transistor having interchangeable source and drain components formed from the $N^+$ arsenic implant portions 24 residing on the P-type substrate region 9 with a gate formed as part of a polysilicon wordline 12.

Although the first and second bitlines 32 and 34 are illustrated with respect to a conductive portion 24 and an optional oxide portion 22, it is appreciated that the bitlines can be formed from a conductive portion only. Furthermore, although the drawing of FIG. 1 illustrates gaps in the silicon nitride layer 16, it is to be appreciated that the silicon nitride layer 16 may be fabricated with out gaps as a single strip or layer.

The silicon nitride layer 16 forms a charge trapping layer. Programming of the cell is accomplished by applying voltages to the drain and the gate while grounding the source. The voltages generate electrical fields along the channel causing electrons to accelerate and jump from the substrate layer 9 into the nitride which is known as hot electron injection. Since the electrons gain the most energy at the drain, these electrons become trapped and remain stored in the nitride layer near the drain. The cell 10 is generally uniform and the drain and source are interchangeable. Since the silicon nitride is non-conducting, a first charge 26 can be injected into the nitride 16 near a first end of the central region 5 and a second charge 28 can be injected into the nitride 16 near a second end of the central region 5. Therefore, if the charge does not move then there can be two bits per cell instead of one bit.

As previously stated, the first charge 26 can be stored in the nitride layer 16 at the first end of the central region 5 and the second charge 28 can be stored at the second end of the central region 5 such that two bits can reside per memory cell 10. The dual bit memory cell 10 is generally symmetrical, thus the drain and the source are interchangeable. Thus, the first bitline 32 may serve as the drain terminal and the second bitline 34 as the source terminal when programming the left bit C0. Likewise, the second bitline 34 may serve as the drain terminal and the first bitline 32 as the source terminal for programming the right bit C1. Table 1 illustrates one particular set of voltage parameters for performing reading, programming and single sided erases of the dual bit memory cell 10 having the first bit C0 and the second bit C1.

TABLE I

| Operation | Cell | Gate | Bitline 0 | Bitline 1 | Comment |
|---|---|---|---|---|---|
| read | C0 | Vcc | 0 v | 1.2 v | complimentary column |
| read | C1 | Vcc | 1.2 v | 0 v | normal column |
| program | C0 | 9.25–9.5 v | 5–5.5 v | 0 v | hot electron |
| program | C1 | 9.25–9.5 v | 0 v | 5–5.5 v | hot electron |
| One side - erase | C0 | −3 to −6 v | 5–6 v | Float | hot hole injection |
| One side - erase | C1 | −3 to −6 v | Float | 5–6 v | hot hole injection |
| Two side - erase | C1, C0 | −3 to −6 v | 5–6 v | 5–6 v | hot hole injection |

Various implementations of dual bit memory cell architecture may be achieved according to one or more aspect of the present invention. In particular, the invention is applicable to memory devices wherein both bits in a dual bit cell are used for data or information storage. The inventors of the present invention have found that program and erasure of one bit (e.g., bit C0) in such a cell effects the programming and/or erasure of its associated bit (e.g., bit C1). For example, repeated programming of bit C1 of cell 10 may cause charge accumulation in bit C0 and vice versa. Also, repeated application of erase voltage pulses to bit C1 may cause over erasure of bit C0. These phenomena in the associated bit C0 may in turn cause degradation with respect to the operation of the bits during normal operation (e.g., the ability to effectively read, write/program, and/or erase one or both bits). The invention addresses these problems with respect to dual bit memory cell technology by selectively programming, verifying, erasing, and re-verifying the individual bits of such memory cells in order to further ensure the proper erasure of the memory cell, for example, in a block or sector erase operation in a flash memory device.

Figure 2:
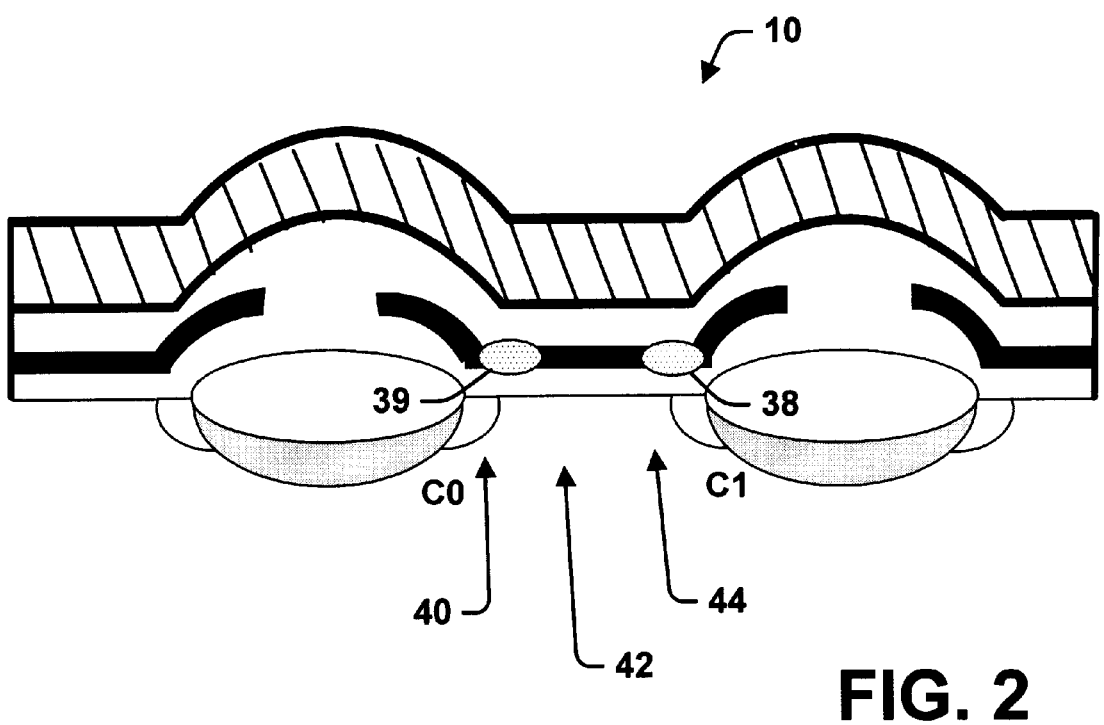
FIG. 2 is a side cross sectional view of the dual bit memory cell illustrating the storing of a programmed charge in a normal region and a complimentary region of the dual bit memory cell.

FIG. 2 illustrates the programming of both bits in the memory cell 10. For purposes of explanation one bit will be referred to as the normal bit (NB), while the associated bit will be referred to as the complimentary bit (CB). During read operations, the junction nearest the cell being read is the ground terminal and the other side of the transistor is the drain. This is called reverse read. The drain is switched during programming and erase back to the nearest junction being the drain voltage instead of ground, which is used for read and verify operations.

The dual bit memory cell 10 may be considered as three individual pieces acting together which are a complimentary bit region 40, a central region 42 and a normal bit region 44. The complimentary bit region 40 and the normal bit region 42 are near the drain/source junctions and the local VT can be modified during programming and erase operations. The central region 42 should be close to the natural VT generated in the fabrication process of the memory cell 10. The silicon nitride 16 from the ONO stack 30 is used to store a first charge 38 in the normal region 44 and a second charge 39 in the complimentary bit region 40. Since nitride is not a conductor, the charge added or removed during the program and erase operations should not redistribute itself but should remain where it is originally injected. This means each side of the transistor can have different charge and different VT almost independent of the other side. For example, if the natural or erase/blank VT of the CB and NB is approximately 1.2V and if the NB is programmed to a VT of approximately 3.8V, the CB should still be close to the blank state. Furthermore, if both bits are programmed to a VT of 3.8V and then the NB is erased then the CB should be at approximately 3.8V and the NB at approximately 1.2V.

Figure 3:
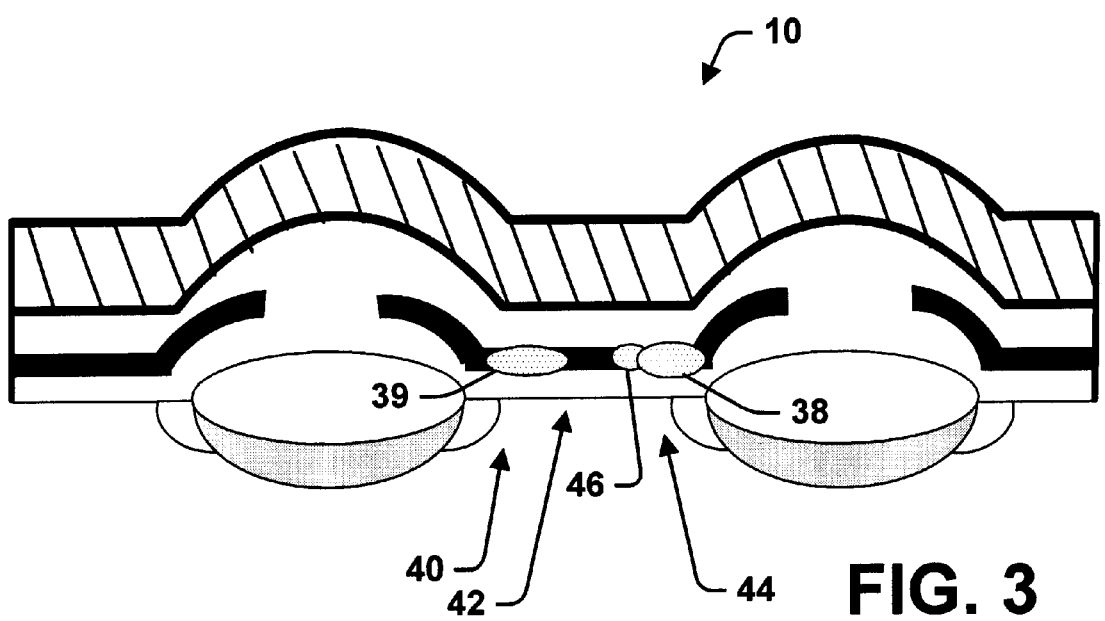
FIG. 3 is a side cross sectional view of the dual bit memory cell illustrating non-uniform charge accumulation into a central region of the cell due to the over-programming of the second bit programmed of the dual bit memory cell.

Additionally, during the read operation for the NB, part of the charge near the CB bitline should be covered by a drain depletion region since the source (ground) is always on the junction nearest the cell being verified. This is called reverse read operation since the verified cell's junction is grounded. Although, the reverse read method covers up some of the charge near the other bits' s junction, any charge in the center of the channel will modify the effective VT of both the CB and the NB. As one of the areas becomes higher or lower in VT, the other regions can also be effected since they are all part of the same transistor. FIG. 3 illustrates how programming of the NB with programming charge 38 into the NB region 44, after the CB has already been programmed with similar program parameters, can cause a buildup of charge 46 to escape partially into the central region 42. The effective shorter channel is due to the charge stored on the first bit near the junction which is grounded during programming of the second bit. The second bit programs much faster than the first bit due to the shorter channel length caused by the first bit being charged. Since the second bit is programmed harder, the second bit erase is slower than the first bit. The present invention solves the problem with harder programming of the second bit by selecting programming parameters that allow for consistent programming and erasure of both bits and eliminating residual charge buildup during programming and erase cycles.

Figure 4:
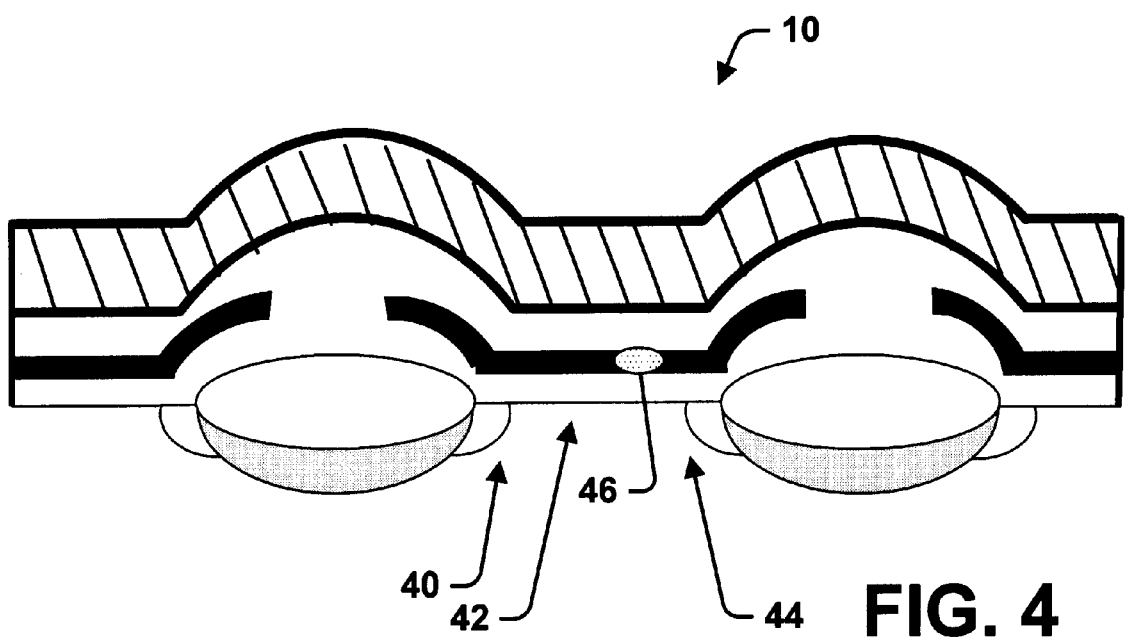
FIG. 4 is a side cross sectional view of the dual bit memory cell illustrating residual charge remaining in the central region of the cells near the array edges after erasure of the cell using only the one sided or two sided erase.

As illustrated in FIG. 4, the buildup of charge 46 may remain in the cell 10 and change the programming and erase characteristics of the cell 10 during each cycle. The location of the additional second bit programmed charge 46 changes the effective VT of the CB region 40 and the NB region 44 and causes the erase time to increase as the number of program and erase cycles increase. The combination of two sided and one sided erase steps provide a stable method to control the dual bit erase for the typical and outer most bits of the array populations. The outer most bits of the array population are usually different in channel length or width and erase much slower using the two sided only method, but typical cells erase best with the two sided erase pulses. Therefore, a one sided erase was added to maintain the erase speed of the outer most bits of the population.

Figure 5:
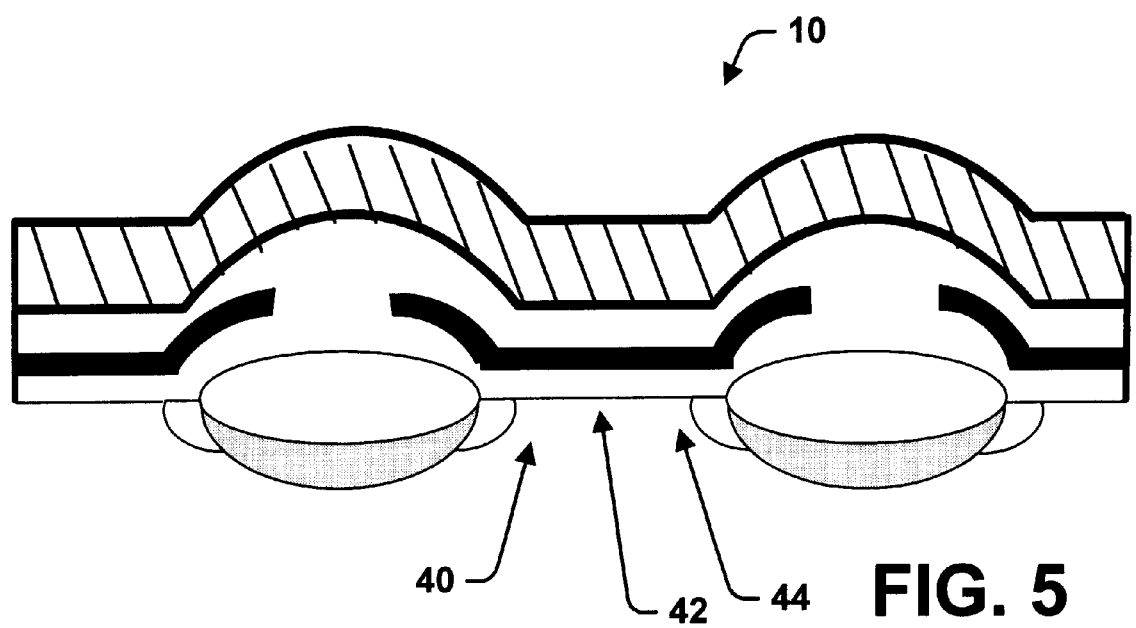
FIG. 5 is a side cross sectional view of the dual bit memory cell illustrating removal of the residual charge remaining in the central region of the cell near the array edges after erasure of the dual bit memory cell in accordance with the present invention.

Therefore, it is important to make sure that the VT of the NB region 44, the central region 42 and the CB region 40 are monitored and maintained at known levels in order to operate the memory cell correctly. Typically, the process of monitoring and controlling the VT of the CB and NB occurs during erase (hereinafter referred to as "the doubled bit erase"). Therefore, in the present invention the programming parameters are selected to ensure that the bits are not over programmed due to residual charge and the erase is performed to ensure that the residual charge in the central region 42 is controlled. By controlling the VT distributions during program and erase, both the erase and program times remain stable during program and erase cycling. FIG. 5 illustrates the memory cell 10 after a programming and erase cycle employing the double bit program and erase methodology of the present invention.

Many flash memories are provided with command logic and embedded state machines which perform the complex programming and erasing operations automatically. A static random access memory (SRAM) module component may include the programs implemented by a micro-controller for use in controlling the operations of command logic and the memory system. These programs are typically loaded into an SRAM when a system is powered up. A bus can be used to send control commands from a processor to the command logic device and to exchange the data read from or written to the flash memory device with the command logic and a host processor. The embedded state machines of the flash device generate the command logic controls for detailed operations such as the various individual steps necessary for carrying out programming, reading and erasing operations. The state machine thus functions to reduce the overhead required of a processor (not depicted) typically used in association with a microchip containing the flash memory.

Figure 6:
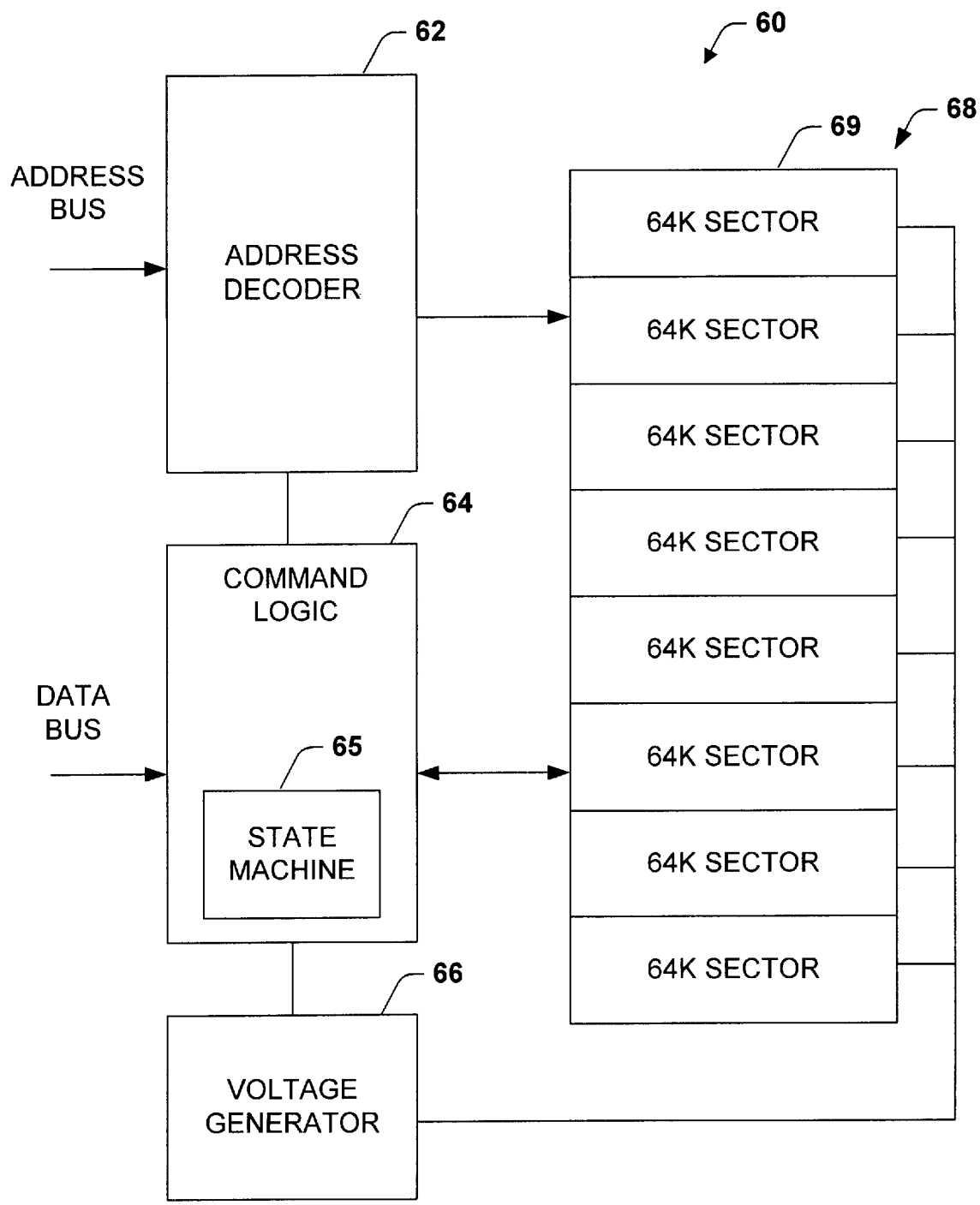
FIG. 6 illustrates a block schematic diagram of a system adapted to carry out various aspects of the invention.

Referring now to FIG. 6, a system 60 is provided for performing programming, verifying, soft programming and erasing of a memory array 68 employing the dual bit memory cells of the present invention. In the present example, the memory array 68 is comprised of a plurality of 64K sectors 69. A sector of the flash memory array 69 includes a portion of the memory array 68 consisting of all the memory cells grouped together via all the wordlines that share the same sector address. The sector address is typically the n (e.g., six) most significant address bits of the address bit signals used to address one or more cells in the memory device where n is an integer. For example, each 64K sector 69 can be comprised of 8 IOs where an IO is a row of 4 cells or 4 dual bit memory cells having 4 normal bits and 4 complimentary. It is to be appreciated that the memory array 68 could be any number of different configurations, for example, 128K sectors comprised of 8 normal bits and 8 complimentary bits on 8 cells. In addition any number of sectors may be employed only limited by the size of the application and the size of the device employing the flash memory array 68.

The system 60 includes an address decoder 62 connected to the flash memory array 68 for decoding IOs during various operations that are performed on the array 68 (e.g., programming, reading, verifying, erasing). The address decoder receives address bus information from a system controller (not shown) or the like.

A command logic component 64 includes an internal state machine 65. The command logic component 64 is connected to the address memory array 68. The command logic and state machine receive commands or instructions from a databus connected to a system controller or the like. The commands or instructions invoke algorithms embedded in the command logic 64 and state machine 65. The algorithms perform the various methodologies of programming, reading, erasing, soft programming and verifying to be described herein. A voltage generator component 66 is also connected to the memory array 68 and the command logic 64 and state machine 65. The voltage generator component 66 is controlled by the command logic 64 and state machine 65. The voltage generator component 66 is operable to generate the necessary voltages for programming, reading, erasing, soft programming and verifying of the memory cells of the memory array 68.

Figure 7:
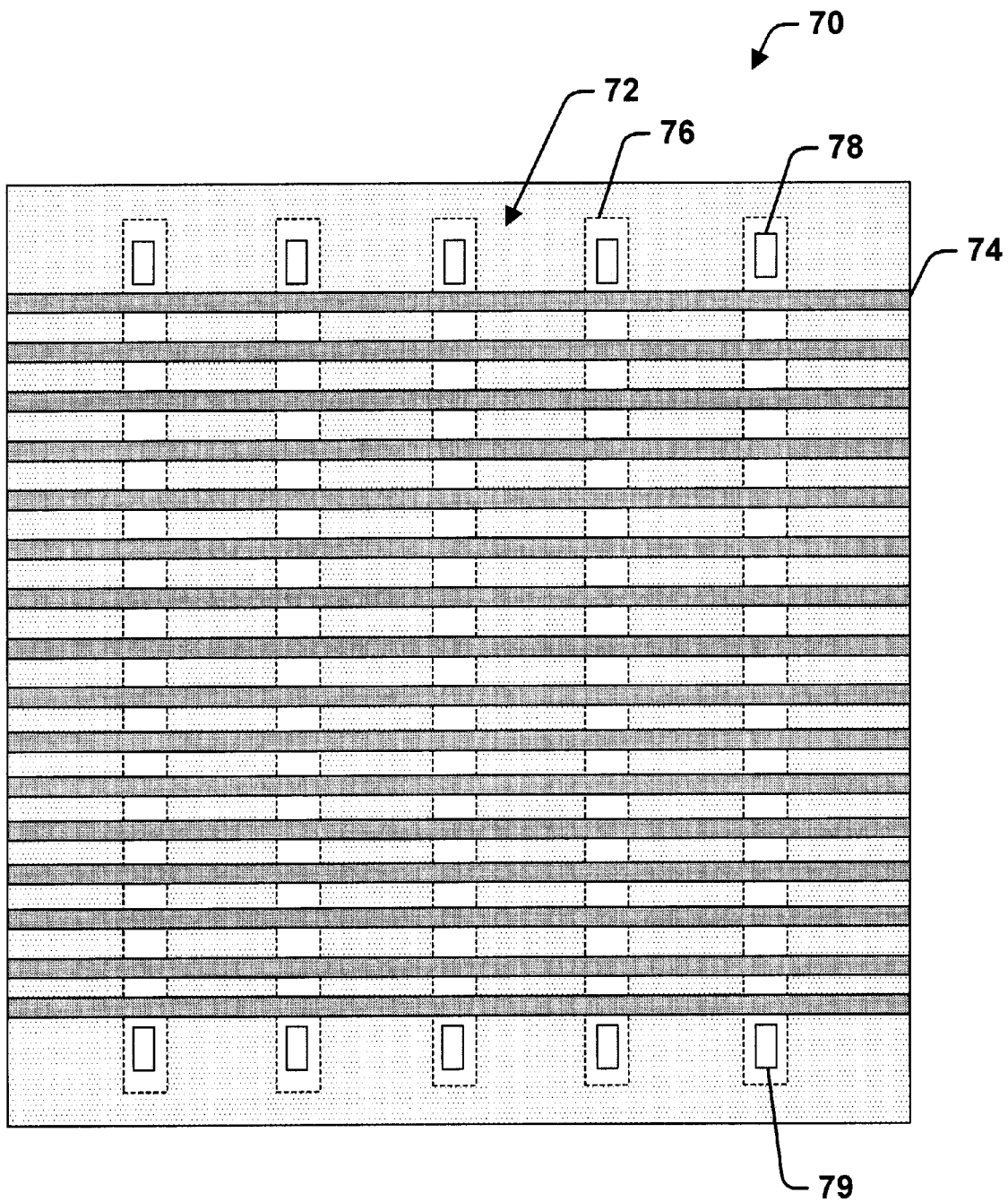
FIG. 7 illustrates a partial top view of a 64K sector of an array of dual bit flash memory having 16 words of 16 bit memory in accordance with the present invention.

FIG. 7 illustrates a partial memory cell layout from a top or plan view of an example of a 64K block 70. The present example is illustrated with respect to a 64K block of 16 bit I/Os. It is to be appreciated that blocks may be 8 bit, 32 bit, 64 bit or more I/Os and are not limited to 64K (e.g., 128K, 256K, etc.). The 64K block 70 can be a sector or a portion of a sector. For example, one or more blocks with the contacts connecting common metal bitlines can form a sector. An ONO stack strip or layer 72 extends the length of the memory array and includes the block 70. The block 70 includes 16 I/Os or groups of columns 79. Each "word" or group of IO's is comprised of eight transistors or eight normal bits and eight complimentary bits. Each I/O includes a polysilicon wordline 74 for addressing the rows of cells. A plurality of bit lines run underneath the ONO stack strip layer 72 for enabling reading, writing and erasing of individual bits of the memory cells. Each bitline is connected to a first contact 78 and metal bitlines (not shown) at one end of a group of sixteen rows and a second contact 79 at the other end of the group. In the example of FIG. 7, five bit lines are illustrated such that a bitline is tied to an end of every other transistor in a column and two select transistors are used to select between four bits of two transistors for reading, writing and erasing.

Figure 8:
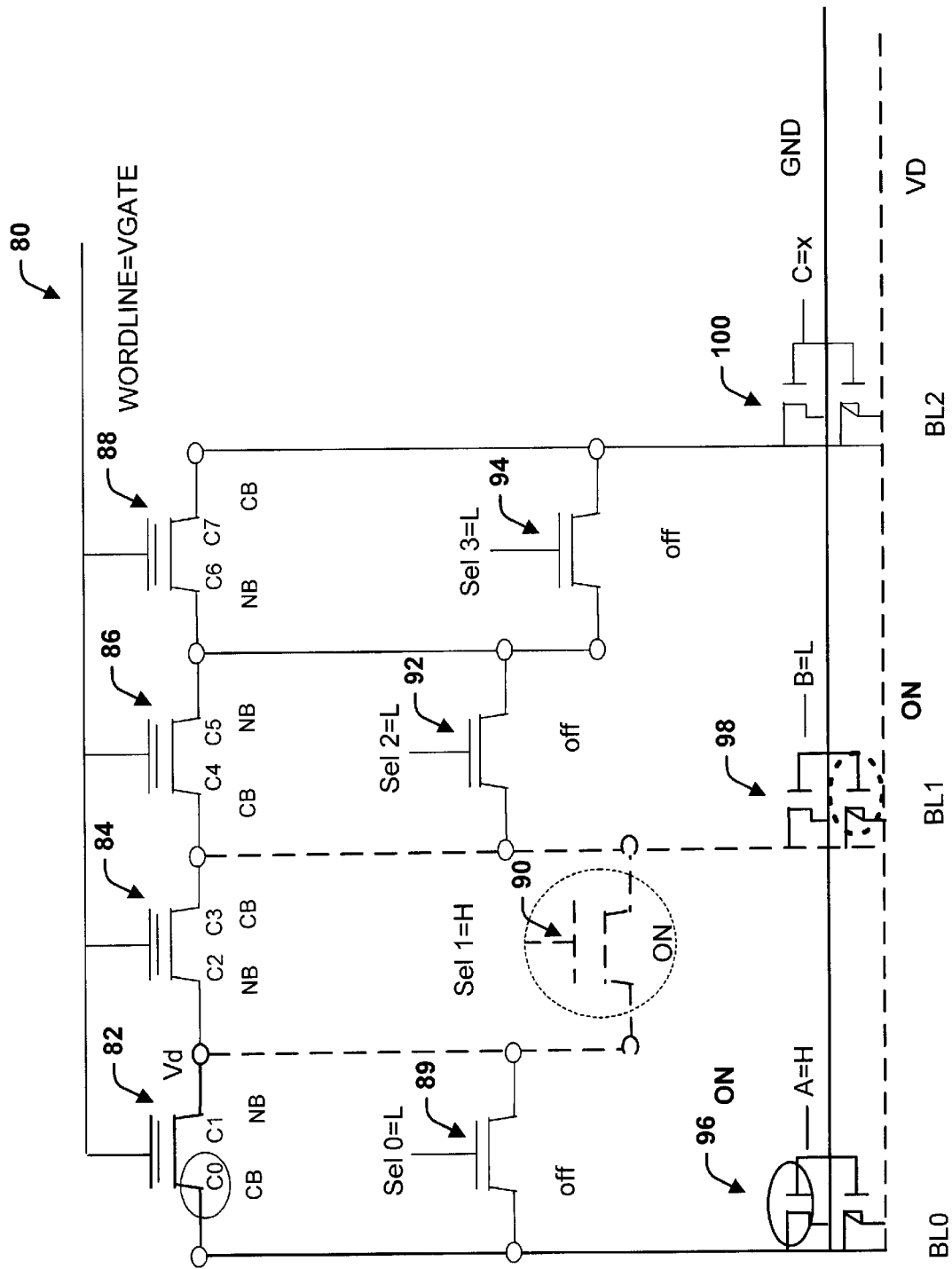
FIG. 8 illustrates a schematic view of a portion of a row of dual bit memory cells in accordance with the present invention.

FIG. 8 illustrates a schematic diagram of addressing of the first four dual bit memory cells in a row utilizing selection transistors and three bitlines for reading, writing and erasing bits. A first dual bit memory cell 82 includes a first bit C0 and a second bit C1, a second dual bit memory cell 84 includes a first bit C2 and a second bit C3, a third dual bit memory cell 86 includes a first bit C4 and a second bit C5 and a fourth dual bit memory cell 88 includes a first bit C6 and a second bit C7. The four dual bit memory cells could form an 8-bit word. A select gate 89 (Sel0) and a select gate 90 (Sel1) are provided to enable reading, writing and erasing of the bits C0, C1 of dual bit memory 82 and bits C2 and C3 of dual bit memory 84. A select gate 92 (Sel2) and a select gate 94 (Sel3) are provided to enable reading, writing and erasing of the bits C4, C5 of dual bit memory 86 and bits C6 and C7 of dual bit memory 88. A first switch 96 is connected to a first bitline BL0, a second switch 98 is connected to a second bitline BL1 and a third switch 100 is connected to a third bitline BL2. The first, second and third switches couple the corresponding bitline between power (VD) and ground (GND). Any bit of the dual bit memory cells can be read by providing different voltage configurations as illustrated in Table 2 below (where H=high state, L=low state, and X=don't care). In the example illustrated in FIG. 8, cell C0 of dual bit memory cell 82 is being read.

VT of second bit programmed near the first bit or double bit erase can be very slow and the first bits programmed will over-erase. In general, it is key to control the drain voltage during programming of the first bit to limit the VT range for the first bit. In order to control the first bit VT, the gate voltage during programming of both bits is selected to be about 9.25 to about 9.5 volts, the drain voltage is selected to be about 5.0 to about 5.5 volts and the pulse width of the program pulse is lowered to 0.5 microseconds ($\mu s$). These conditions help maintain a tight first bit VT and slow down the second bit programming.

Figure 10:
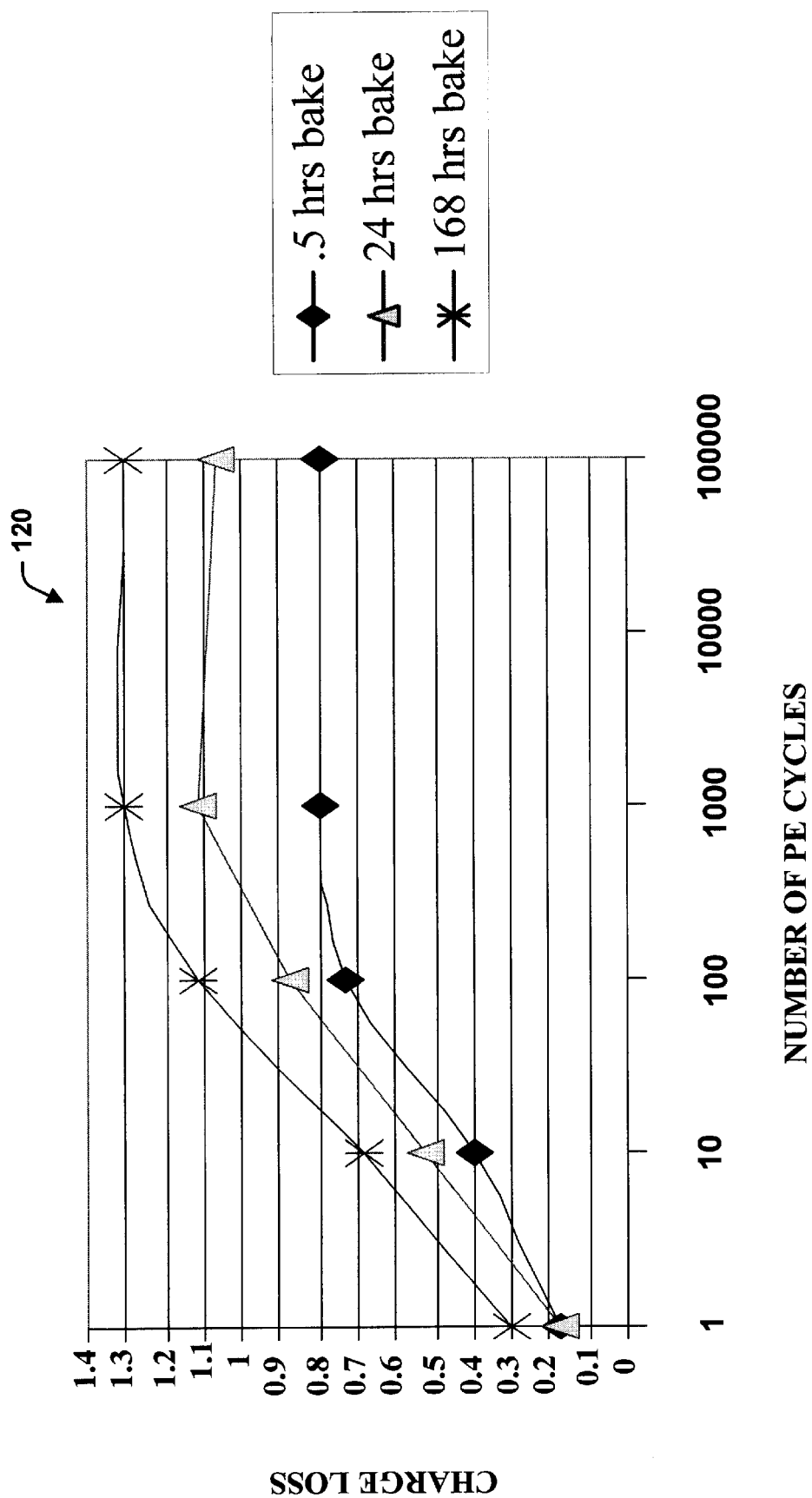
FIG. 10 illustrates a graph of delta VT charge loss versus program and erase cycles in accordance with one aspect of the present invention.

A key characteristic of the ONO double bit memory cell is that the charge loss during accelerated high temperature bake (75–200° C.) is a strong function of the number of program and erase cycles. FIG. 10 illustrates a graph 120 of the charge loss in voltages versus the number of program and erase (PE) cycles. This presents a possible reliability issue since the amount of charge loss increases with cycling up to 10,000 program and erase cycles. The single bit programmed state (which occurs when one side of the transistor is programmed and the other is blank or un-programmed) of the transistor shows this problem with increased charge loss with larger number of cycles. The case with both bits programmed actually looses less charge than the 10 or 01 state. Therefore, a programming delta VT was selected between 2–2.5 volts to compensate for charge loss due to cycling.

Figure 11:
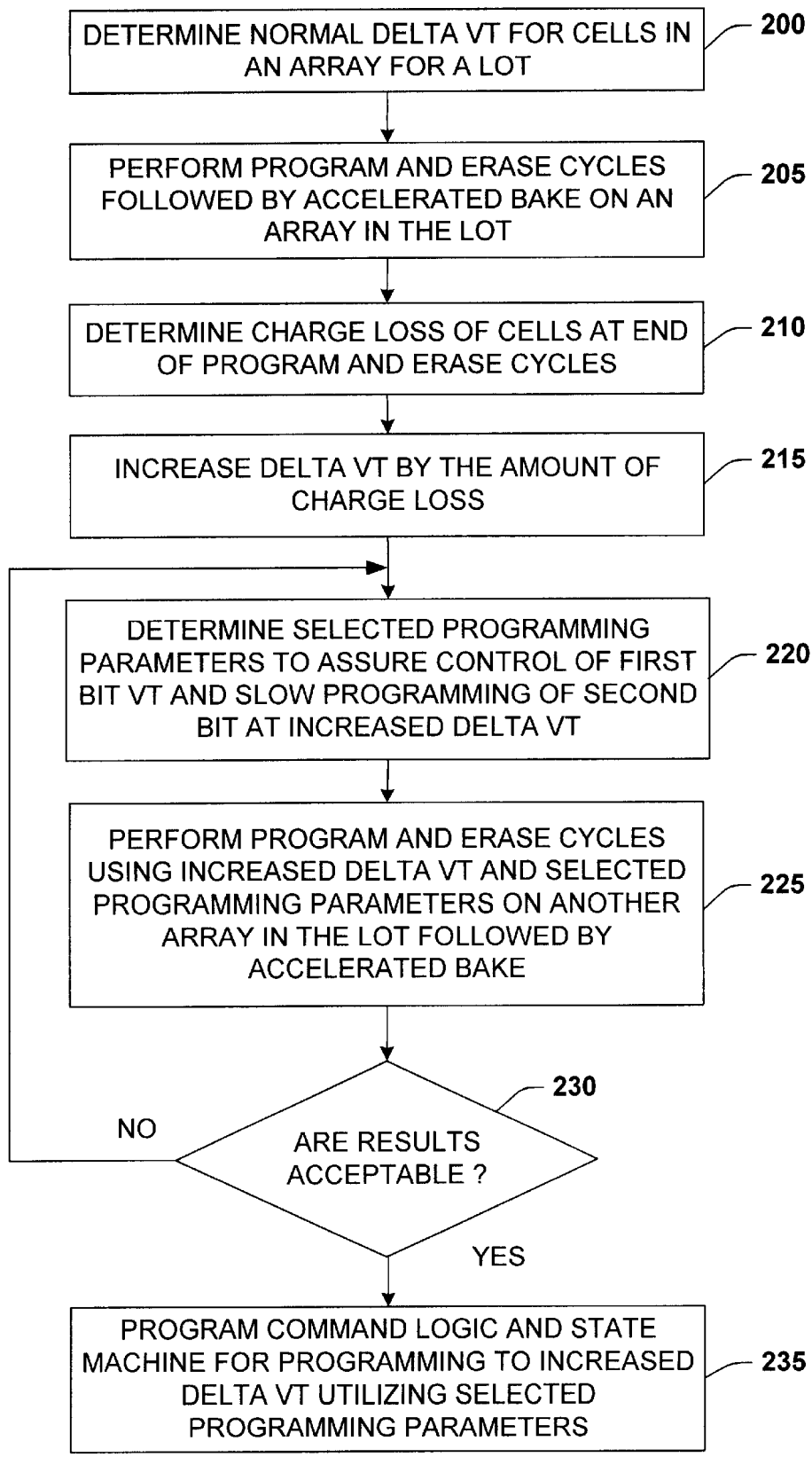
FIG. 11 is a flow diagram illustrating a methodology for determining a substantially high delta VT and selected programming parameters for programming first and second bits of dual bit memory cells in accordance with an aspect of the invention.
Figure 14:
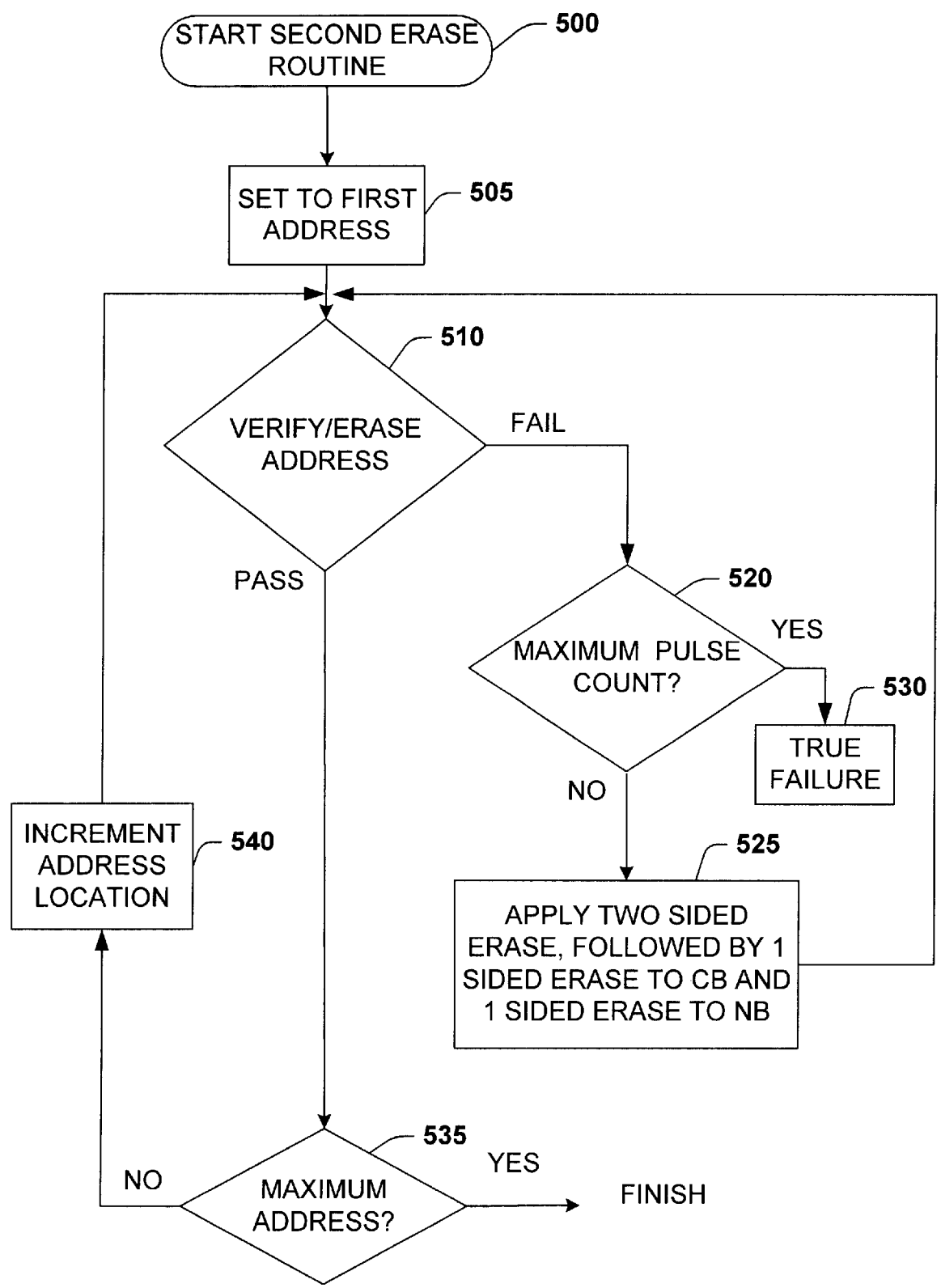
FIG. 14 is a flow diagram illustrating a methodology for verify erasure of cells in the array of dual bit memory cells after the soft programming method of FIG. 13 in accordance with an aspect of the invention.

In view of the exemplary systems shown and described above, a methodology, which may be implemented in accordance with the present invention, will be better appreciated with reference to the flow diagrams of FIGS. 11 and 14. While, for purposes of simplicity of explanation, the methodologies of FIGS. 11 and 14 are shown and described as executing serially, it is to be understood and appreciated that the present invention is not limited by the illustrated order, as some blocks may, in accordance with the present invention, occur in different orders and/or concurrently with other blocks from that shown and described herein. Moreover, not all illustrated blocks may be required to implement a methodology in accordance with the present invention.

A key characteristic of the dual bit memory cells in the flash memory array of the present invention is that the charge loss during accelerated high temperature bake

TABLE 2

| cell | WL | A | B | C | sel 0 | sel 1 | sel 2 | sel 3 | BL 0 | BL 1 | BL 2 |
|------|------|---|---|---|-------|-------|-------|-------|------|------|------|
| C0 | Vgate | H | L | x | L | H | L | L | GND | VD | X |
| C1 | Vgate | L | H | x | L | H | L | L | VD | GND | X |
| C2 | Vgate | H | L | x | H | L | L | L | GND | VD | X |
| C3 | Vgate | L | H | x | H | L | L | L | VD | GND | X |
| C4 | Vgate | x | H | L | L | L | L | H | X | GND | VD |
| C5 | Vgate | x | L | H | L | L | L | H | X | VD | GND |
| C6 | Vgate | x | H | L | L | L | H | L | X | GND | VD |
| C7 | Vgate | x | L | H | L | L | H | L | X | VD | GND |

Figure 9:
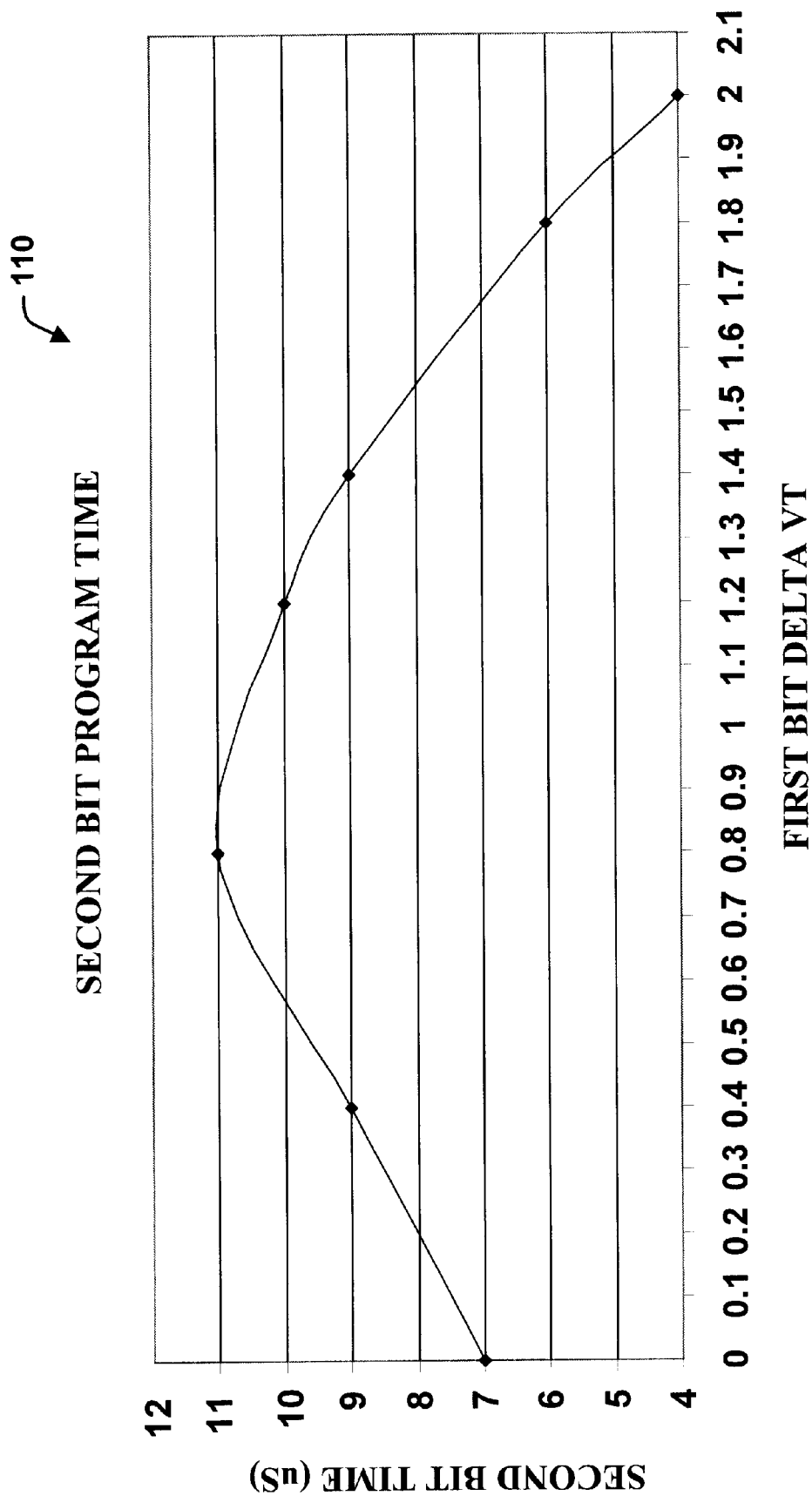
FIG. 9 illustrates a graph of a first bit delta VT versus a second bit programming time in accordance with one aspect of the present invention.

During double bit programming, a higher delta VT is selected to compensate for post cycling charge loss. At these higher delta VT's, the first bit on a transistor programs at a much slower rate than the second bit. This is not the case at much lower program VT's. FIG. 9 illustrates a graph 110 of the second bit program time versus the first bit delta VT. Since the second bit appears to program harder and faster, the second bit determines the double bit erase time and the methods that can be used for erase on double bit. It is important to select conditions for programming that keep the (75–250° C.) is a strong function of the number of program and erase cycles. This presents a possible reliability issue since the amount of charge loss increases with cycling up to 10,000 program and erase cycles. The single bit one-zero or zero-one state (which occurs when one sides of the transistor is programmed and the other is blank or un-programmed) of the transistor shows this problem with increased charge loss with larger number of cycles. At 250° C. bake temperatures, the cell transistor behavior is not Guassian. At 250° C., the cell transistors near larger wordline (poly gates in core) gaps losses more charge due to redistribution of the charge in the nitride and the locally enhanced trapped nitride charge near the larger poly gaps. The charge loss distribution was found to be repeatable from die to die for the same data pattern for all devices cycled over the same number of cycles. The program and erase conditions during cycling appear to have little impact on the relationship of the charge loss verses number of cycles for cycling over 1000 cycles.

In order to account for the charge loss after 100k cycles, the program delta VT (e.g., delta VT=2–2.5 volts) is increased to ensure valid VT of a programmed cell at the end of the life of the flash memory array. It was determined that the dual bit memory cell can be programmed to a higher VT (2.0–2.5 Volts) and still maintaining very short programming times for double bit operation by selecting specific programming parameters (e.g., 0.5 microseconds per word programming pulses at Vgate=9.25–9.5 Volts and Vdrain=5.0–5.5 Volts). It was determined that the charge loss is a function of the number of PE cycles at the higher temperatures (e.g., 250° C.). The method of correcting for this type of cycling related charge loss was to program cells to a delta VT between 2.0 to 2.5 Volts and to program the bits slower (e.g., 0.5 microseconds per word programming pulses at Vgate=9.25–9.5 Volts and Vdrain=5.0–5.5 Volts) to better control the complimentary bit disturb effects associated with double bit programming.

FIG. 11 illustrates one particular methodology for determining a delta VT voltage for a dual bit memory cell of a memory array operating in double bit mode in accordance with one aspect of the present invention. The method begins at step 200 were a normal blank or un-programmed VT of the memory cells in an array for a lot (production measurement unit containing multiple arrays) is determined. At step 205, a number of program and erase cycles are performed on the array in the lot with various delta VT's for programming followed by a high temperature accelerated bake (100–250° C.). The charge loss of the cells is then determined, at step 210. At step 215, the delta programming VT is increased based on the amount of charge loss. At step 220, programming parameters (e.g., 0.5 microseconds per word programming pulses at Vgate=9.25–9.5 Volts and Vdrain=5.0–5.5 Volts) are selected to assure control of the first bit VT and slow programming of the second bit at the increases delta VT. At step 225, program and erase cycles are performed on another array in the lot using the selected programming parameters followed by an accelerated bake. At step 230, the method determines if the results of the programming and erase cycles utilized in step 225 are acceptable. If the results of the programming and erase cycles are not acceptable (NO), the method returns to step 220. If the results of the programming and erase cycles are acceptable (YES), the command logic and state machine are programmed to program both bits of the dual bit memory cells utilizing the delta VT and the selected drain and gate potentials in step 235.

Figure 12:
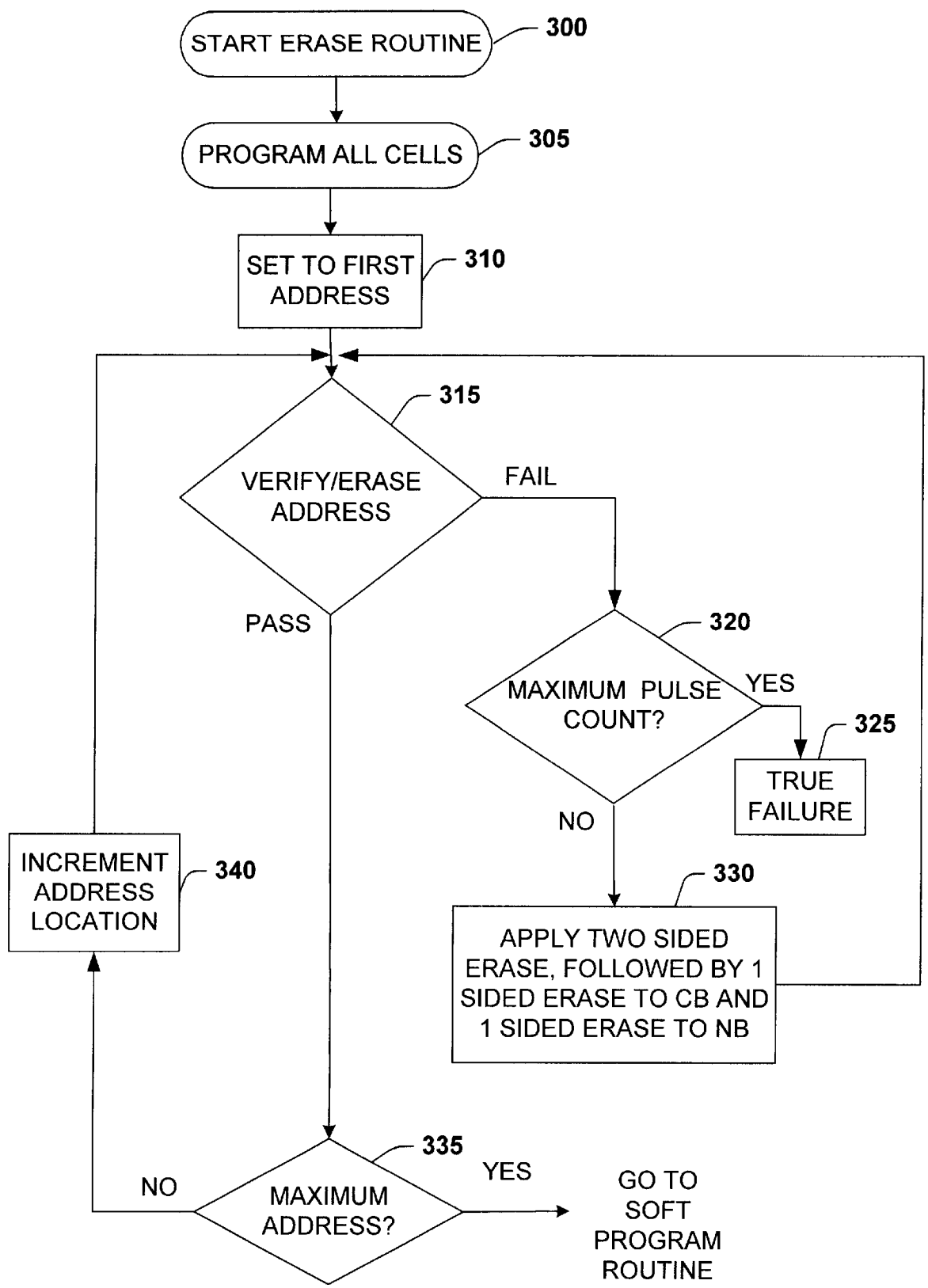
FIG. 12 is a flow diagram illustrating a methodology for erase verifying of an array of dual bit memory cell in accordance with an aspect of the invention.

It is to be appreciated that programming using a higher delta VT can be utilized not only in normal programming conditions, but also for pre-programming or programming during a double bit erase methodology. FIG. 12 illustrates a methodology of utilizing the selected programming parameters (e.g., 0.5 microsecond programming pulses at Vgate=9.25–9.5 Volts and Vdrain=5.0–5.5 Volts, delta VT between 2–2.5 Volts).

Figure 13:
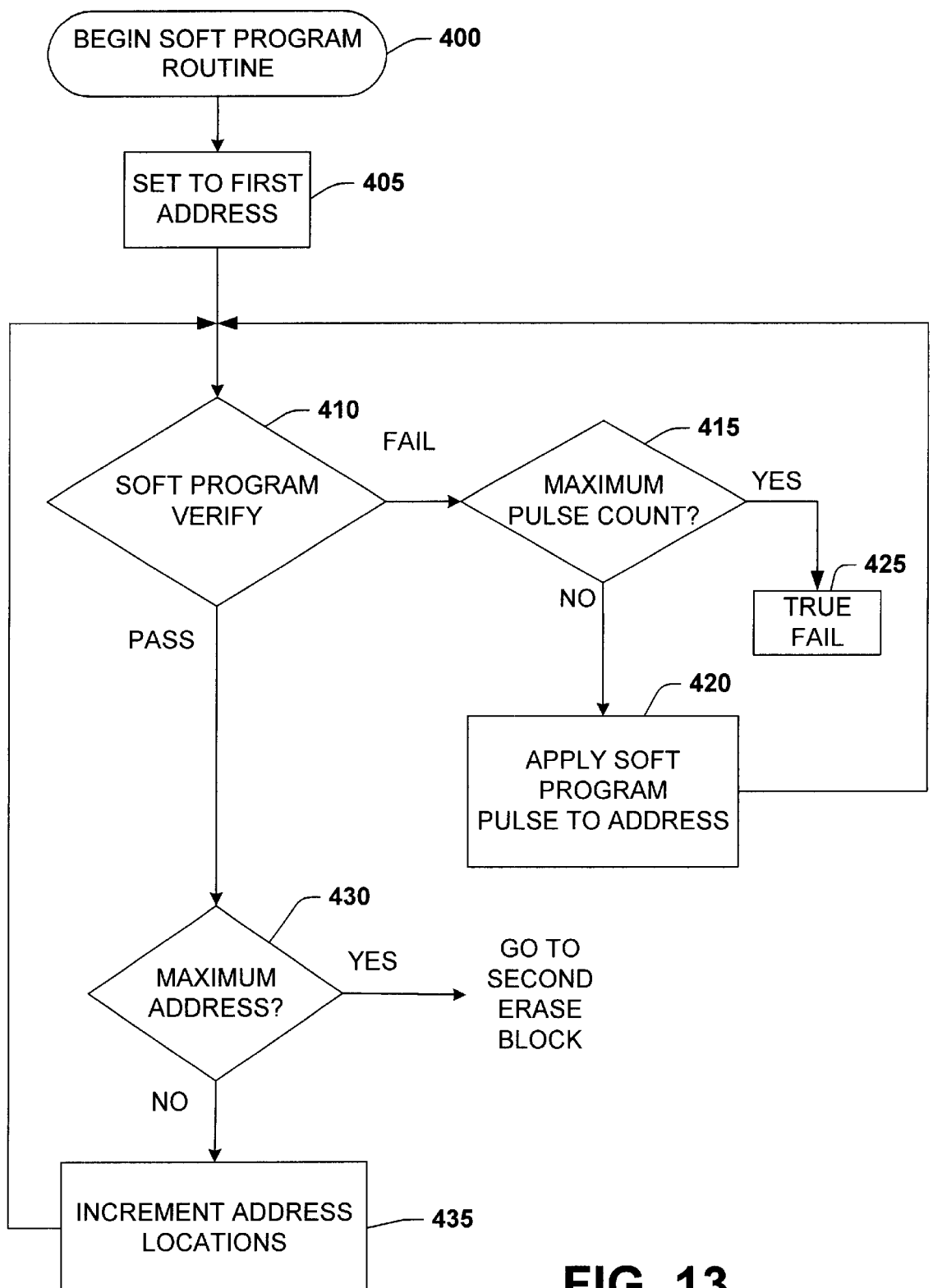
FIG. 13 is a flow diagram illustrating a methodology for soft programming of cells in the array of dual bit memory cells after the erasure verifying method of FIG. 12 in accordance with an aspect of the invention.

The double bit erase methodology of FIGS. 12–14 includes a cell erase routine to control the upper and lower threshold limit of VT for a blank or erased condition (e.g., min VT=1.0V, max VT=1.8V) for both the complimentary and normal sides of each memory transistor. Furthermore, the double bit erase methodology includes a soft programming routine that controls the programming time by preventing over-erase of the cells which can lead to longer programming times. The soft programming can also impact the amount of charge loss after cycling. Finally the double bit erase routine may include a second erase to assure that any cells have not been programmed from the soft programming routine. The double bit methodology of FIGS. 12–14 improves the program and erase characteristics of the Flash memory array of the present invention operating during extended cycling (e.g., 100,000 program and erase (PE) cycles).

FIG. 12 illustrates an erase methodology utilizing hot hole injection near the high voltage drain junction for both the normal and complimentary bit. The process of heavy programming on one bit causes a build up of residual charge that cannot be reached during the single sided or classical erase over acceptable voltage levels and/or acceptable erase times. The double bit erase method ensures control of both the normal and complimentary bit blank VT by a verification and modified method erase with each cycle. Therefore, the double bit erase methodology applies a series of erase conditions or sequences during each pulse to both the complimentary bit(s) and its associated normal bit(s) within a single cell(s). The first erase sequence of each pulse is a two sided or two drain erase pulse which brings both the source and drain of all cell transistors to high voltage (e.g., 4–7v). The complimentary bit and its associated normal bit is allowed to discharge. Then a single sided erase pulse is applied to the complimentary bit (e.g., complimentary drain goes to high voltage with the other transistor junction floated) followed by a single sided erase pulse to the normal bit (e.g., normal drain goes to high voltage with the other transistor junction floated). The order of the single sided pulses may be interchangeable regardless of the bit being verified. Significant improved results are achieved in the ONO double bit architecture when the two sided erase pulse is about 75%–95% of the total erase pulse time.

FIG. 12 illustrates one particular methodology for performing a programming and erase of a flash memory array having dual bit memory cells in accordance with one aspect of the present invention. The method begins at step 300 where the erase routine is invoked. The erase routine may be invoked, for example, by a command from a controller to a state machine residing on a flash device. Both the bits in normal column locations and complimentary column locations are programmed to a delta VT at step 305. The selected programming voltage parameters are 0.5 microsecond pulses at Vgate=9.25–9.5 Volts and Vdrain=5.0–5.5 Volts with a delta VT between 2–2.5 Volts. The method then advances to step 310 where an address counter pointing to the memory address of the array is set to the first address. The methodology then proceeds to step 315. At step 315, the method performs a verify erase for an address location in a sector. The address location can be a memory address of a single bit location or a memory address of an I/O or word location of the sector. If the verify erase of the address location fails, the methodology proceeds to step 320. At step 320, the methodology determines if the maximum pulse count has been reached. If the maximum pulse count has been reached (YES), the methodology proceeds to step 325 where a true failure of the device is indicated. If the maximum pulse count has not been reached (NO), the methodology advances to step 330 to apply erase pulses.

At 330, the methodology applies a two sided erase pulse to both complimentary column and normal column locations of the sector for a duration of 8 to 12 ms (e.g., a 10 ms pulse).

After a discharge time duration, a first single sided pulse is applied to the bits in the complimentary column location for a duration of 0.5 to 2 ms (e.g., 1 ms) followed by a second single sided pulse to bits in the normal column locations for a duration of 0.5 to 2 ms (e.g., 1 ms). The methodology then returns to step 315 for a verification of the erase of the current address location. If the verify erase of the current address locations passes, the methodology proceeds to step 335 to determine if the current bit or I/O address is the maximum address location. If the current cell or I/O address is not the maximum address location (NO), the address location of the address counter is incremented to the next address location at step 340. The method then returns to step 315 to perform a verification of the erase of the next address location. If the maximum address has been reached (YES) at step 335, the method advances to the soft program routine in FIG. 13 to ensure that the memory cells have not been over-erased.

A methodology of soft programming is utilized to control the minimum (over-erased) normal and complimentary bit VT's of a blank state after the erase methodology of FIG. 12. Over-erased cells are any VT under the minimum value for a blank state and are not classical column leakage bits. Although, it was not believed possible to store trapped holes in the nitride layer, the electrical fields used to erase the memory cells are very high and the local VT of the cells can be reduced below the natural state. When this occurs, the programming time for the over-erased cells will increase for one or both the normal bit and complimentary bit cells. Therefore, the soft programming methodology of FIG. 13 is performed to eliminate over-erased cells and maintain stable programming times during cycling.

FIG. 13 illustrates one particular methodology for performing soft programming of the flash memory array to ensure that the memory cells of the flash memory have not been over-erased. At step 400, the soft programming routine begins. The soft programming routine may be invoked, for example, by a command from a controller to a state machine residing on a flash device. Alternatively, the soft program routine may be part of the overall erase routine and begin after completion of the methodology of FIG. 12. The method then advances to step 405 where the address counter is set to the first address. The methodology then proceeds to step 410. At step 410, the method performs a verify of the soft program for the first address location. The verify should include a slight source voltage to repress any subthreshold leakage currents. If the verify soft program of the address location fails, the methodology proceeds to step 415 to determine if the maximum pulse count (e.g., 5 pulses) has been reached. If the maximum pulse count has been reached (YES), a true failure is indicated at step 425. If the maximum pulse count has not been reached (NO), the method advances to step 420 to apply a soft program pulse to the address location and returns to step 410 to verify if the address location has passed the soft programming verify condition. If the address location of the sector passes at step 410, the method proceeds to step 430 and determines if the maximum address of the sector has been reached. If the maximum sector address has not been reached (NO), the address location of the address counter is moved to the next address location at step 435 and the method returns to step 410 to repeat the steps of soft programming verify of the next address location in the memory array. If the maximum address location has been reached (YES) at step 430, the method advances to the second erase block of FIG. 14.

FIG. 14 illustrates one particular methodology for performing a second erase block of the flash memory array to ensure that the soft programming routine did not over program the memory cells in accordance with one aspect of the present invention. The method begins at step 500 at the second erase block. The second erase routine may be invoked, for example, by a command from a controller to a state machine residing on a flash device. Alternatively, the second erase routine may be part of the overall erase routine and begin after completion of the methodologies illustrated in FIGS. 12 and 13. The method then advances to step 505 where the address counter is set to the first address location. The methodology then proceeds to step 510. At step 510, the method performs a verify erase for an address location in a sector of the memory array. The address location can be a memory address of a single bit location or a memory address of an I/O or word location of the sector. If the verify erase of the address location fails, the methodology proceeds to step 520. At step 520, the methodology determines if the maximum pulse count has been reached. If the maximum pulse count has been reached (YES), the methodology proceeds to step 530 where a true failure of the device is indicated. If the maximum pulse count has not been reached (NO), the methodology advances to step 525 to apply erase pulses.

At 525, the methodology applies an erase pulse to both complimentary column locations and normal column locations of the sector for a duration of 8 to 12 ms (e.g., a 10 ms pulse). After a discharge time duration, a single sided pulse is applied to the bits in the complimentary column location for a duration of 0.5 to 2 ms (e.g., 1 ms) followed by a single sided pulse to bits in the normal column locations for a duration of 0.5 to 2 ms (e.g., 1 ms). The methodology then returns to step 510 for a verification of the erase of the current address location. If the verify erase of the current address locations passes, the methodology proceeds to step 535 to determine if the current bit or I/O address is the maximum address location. If the current cell or I/O address is not the maximum address location (NO), the address location of the address counter is incremented to the next address location at step 540. The method then returns to step 510 to perform a verification of the erase of the next address location. If the maximum address has been reached (YES) at step 535, the method is finished and the device returns to normal operation.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application.

What is claimed is:

1. A method of programming bits in an ONO dual bit memory cell operating in a double bit mode, the method comprising:

applying a program pulse to at least one bit of the dual bit memory cell by concurrently applying a voltage to a drain of the at least one bit and applying a voltage to a gate of the at least one bit;

verifying a delta VT of the at least one bit is within a range of about 2.0 to about 2.5 volts; and repeating the step of applying a program pulse until the delta VT of the at least one bit is within the range of about 2.0 to about 2.5 volts.

2. The method of claim 1, the step of applying a program pulse comprising concurrently applying a voltage in a range of about 5 to about 5.5 volts to the drain and applying a voltage in a range of about 9.25 to about 9.5 volts to the gate.

3. The method of claim 2, the program pulse having a duration of about 0.5 microseconds.

4. The method of claim 1, the ONO dual bit memory cell operating in a double bit mode wherein the ONO dual bit memory cell has a normal bit and a complimentary bit wherein both the normal bit and the complimentary bit is programmed.

5. The method of claim 4, further comprising:

performing a verify erase of the normal bit; and performing a verify erase of the complimentary bit.

6. The method of claim 5, the step of verify erase of the normal bit and complimentary bit comprising repeating steps of verifying and applying erase pulses until both the normal bit and complimentary bit are in a blank state.

7. The method of claim 6, further comprising verifying if a VT of the normal bit is below a minimum allowable VT for the blank state and applying a soft program pulse to the normal bit if the VT of the normal bit is below the minimum allowable VT for the blank state.

8. The method of claim 7, further comprising verifying if a VT of the complimentary bit is below the minimum allowable VT for the blank state and applying a soft program pulse to the complimentary bit if the VT of the complimentary bit is below the minimum allowable VT for the blank state.

9. The method of claim 8, further comprising verifying if the VT of the normal bit is above a maximum allowable VT for a blank state caused by applying a soft program pulse to the normal bit and applying at least one erase pulse if the VT of the normal bit is above the maximum allowable VT for the blank state.

10. The method of claim 9, further comprising verifying if the VT of the complimentary bit is above the maximum allowable VT for the blank state caused by applying a soft program pulse to the complimentary bit and applying at last one erase pulse if the VT of the complimentary bit is above the maximum allowable VT for the blank state.

11. A method of determining programming parameters for programming bits of an array of ONO dual bit memory cells operating in a double bit mode, the method comprising:

performing a predetermined number of program and erase cycles followed by an accelerated bake on at least one array in a lot;

determining a charge loss of at least one bit of the at least one array after the program and erase cycles and accelerated bake;

determining an increase in delta VT to accommodate for the charge loss of the at least one bit of the at least one array for additional arrays in the lot; and determining programming parameters to allow programming of the cells at the increased delta VT in an acceptable time, the programming parameters comprising a programming pulse width, a potential of a programming pulse at a gate of a cell and a potential of the programming pulse at a drain of the cell.

12. The method of claim 11, the programming pulse width being about 0.5 microseconds at a selected gate potential of about 9.25 to about 9.5 volts and a selected drain potential of about 5.0 to about 5.5 volts.

13. The method of claim 12, further comprising a step of programming a command logic and state machine for programming to an increased delta VT utilizing the selected drain and gate potentials.

14. The method of claim 12, the array of ONO dual bit memory cells operating in a double bit mode wherein each of the ONO dual bit memory cells have a normal bit and a complimentary bit wherein both the normal bit and the complimentary bit is programmed.

15. A system for programming bits in an array of ONO dual bit memory cells operating in a double bit mode, the system comprising:

an array of dual bit flash memory cells;

an address decoder component coupled to the array of ONO dual bit flash memory cells, the address decoder component providing access to bits of the ONO dual bit flash memory cells;

a voltage generator to provide appropriate voltages for performing programming and erasing of bits of the ONO dual bit flash memory cells; and a command logic component including a state machine, the command logic component and state machine being coupled to the array and the address component and being operable to control the voltage generator, the command logic component and state machine having a capability to program at least one bit by selecting the at least one bit and applying a program pulse that applies a first voltage to a drain and a second voltage to a gate of a cell, verifying a delta VT of the at least one bit is within a range of about 2.0 to about 2.5 volts and repeating the step of applying a program pulse until the delta VT of the at least one bit is within the range of about 2.0 to about 2.5 volts.

16. The system of claim 15, the voltage to the drain being in a range of about 5.0 to about 5.5 volts and the voltage to the gate being in a range of about 9.25 to about 9.5 volts.

17. The system of claim 16, the program pulse having a duration of about 0.5 microseconds.

18. The method of claim 15, the array of ONO dual bit memory cells operating in a double bit mode wherein each of the ONO dual bit memory cells have a normal bit and a complimentary bit wherein both the normal bit and complimentary bit are programmed.

19. The system of claim 18, the command logic component further being operable to receive an erase command and execute an erase algorithm that programs normal bits of the memory cells to a delta VT within the range of 2.0 to 2.5 volts, performs a verify erase of the normal bits in the normal columns and performs a verify erase of the complimentary bits in adjacent complimentary columns.

20. The system of claim 19, the erase algorithm being further adapted to continue the verify erase of the normal bits in the normal columns and the complimentary bits in the adjacent complimentary columns for the normal and complimentary bits in a sector of memory until all of the bits have a VT below a maximum allowable VT for a blank state.

21. The system of claim 20, the erase algorithm being further operable to verify if the VT of the bits in the normal columns are below a minimum allowable VT for the blank state and applying a soft program pulse via the voltage generator to the bits in the normal columns if the VT of any of the bits are below the minimum allowable VT for the blank state.

22. The system of claim 21, the erase algorithm being further operable to verify if the VT of the bits in the adjacent complimentary columns are below the minimum allowable VT for the blank state and applying a soft program pulse via the voltage generator to the bits in the adjacent complimentary columns if the VT of any of the bits are below the minimum allowable VT for the blank state.

23. The system of claim 22, the erase algorithm being further performing a verify erase of bits in normal columns and performing a verify erase of complimentary bits in adjacent complimentary columns if any of the bits in the normal columns and the adjacent complimentary columns have a VT above the maximum allowable VT for the blank state caused by the soft program pulse.

24. A system for programming bits in an ONO dual bit memory cell, comprising:

means for programming bits in the ONO dual bit memory cell to a delta VT within a range of 2.0 to 2.5 volts; and means for verifying that the delta VT of programmed bits are within the range of 2.0 to 2.5 volts.

25. The method of claim 24, the means for programming bits in the ONO dual bit memory cell to a delta VT within the range of 2.0 to 2.5 volts being further applying a programming pulse to a bit in the cell having a duration of about 0.5 microseconds at a voltage to a drain of the cell being in a range of about 5.0 to about 5.5 volts and a voltage to a gate of the cell being in a range of about 9.25 to about 9.5 volts.

* * * * *